United States Patent [19]
Rostoker

[11] Patent Number: 5,837,615
[45] Date of Patent: Nov. 17, 1998

[54] INTEGRATED CIRCUIT DEVICE FABRICATION BY PLASMA ETCHING

[75] Inventor: Michael D. Rostoker, Boulder Creek, Calif.

[73] Assignee: LSI Logic Corporation, Milpitas, Calif.

[21] Appl. No.: 912,944

[22] Filed: Aug. 14, 1997

Related U.S. Application Data

[63] Continuation of Ser. No. 531,473, Sep. 21, 1995, abandoned.

[51] Int. Cl.$^6$ .................................................. H01L 21/302
[52] U.S. Cl. .......................... 438/711; 438/729; 438/710; 216/68; 216/71
[58] Field of Search ..................................... 438/710, 711, 438/718, 719, 720, 729; 204/192.37, 192.35, 192.32, 298.34; 216/67, 68, 71

[56] References Cited

U.S. PATENT DOCUMENTS 5,277,751  1/1994  Ogle .......................................... 156/643
5,401,350  3/1995  Patrick et al. ............................. 156/345

OTHER PUBLICATIONS

Plasma Etching An Introduction, Edited by Dennis M. Manos, Plasma Physics Laboratory, Princeton University, Princeton, New Jersey and Daniel L. Flamm AT&T Bell Laboratories, Murray Hill, New Jersey, p. 37.

Primary Examiner—R. Bruce Breneman
Assistant Examiner—Luz Alejandro
Attorney, Agent, or Firm—Beyer & Weaver,LLP

[57] ABSTRACT

A trench etching process is disclosed in which a substrate is etched under conditions that promote forward sputtering of mask material in a plasma reactor having at least three electrodes. The forward sputtering impedes etching of trench sidewalls by depositing a protective layer of mask material on the sidewalls of a trench being formed. By controlling the amount of forward sputtering, one can control the trench profile and aspect ratio (depth to width). By employing forward sputter etching in a three or more electrode reactor, trenches of less than one micron in width and having aspect ratios of at least 2.5:1 are formed. Such trenches are used in trench capacitors of high density DRAMs. A disclosed plasma reactor includes a grounded first electrode which forms part of the reactor's enclosure, a coiled second electrode disposed above and separated from the reactor enclosure by a dielectric shield, and a planar third electrode located below the substrate to be etched. A plasma is generated by providing radio frequency energy from the second electrode to the enclosure interior. The charged species from that plasma are directed to the substrate by applying a bias between the first and third electrodes.

25 Claims, 4 Drawing Sheets

INTEGRATED CIRCUIT DEVICE FABRICATION BY PLASMA ETCHING

This is a continuation of application Ser. No. 08/531,473 filed Sep. 21, 1995, now abandoned.

BACKGROUND OF THE INVENTION

The present invention relates generally to methods of forming trenches in wafers during fabrication of integrated circuits ("ICs"). More particularly, the invention relates to methods of forming such trenches by highly anisotropic plasma etching in reactors having three or more electrodes and employing process conditions for forward sputtering mask material onto trench sidewalls during etching.

Fabrication of some integrated circuits requires formation of trenches in a semiconductor substrate. For example, MOS devices on integrated circuits are sometimes electrically isolated from one another by trenches. Further, in "trench type" dynamic random access memory chips ("DRAMs"), trenches are used to form the capacitors that store individual bits of information.

Such applications are becoming increasingly important in IC fabrication because trenches utilize a substrate's third dimension (i.e., the direction normal to the substrate surface), and therefore occupy only very little area on the top surface of the substrate. While other techniques for device isolation and capacitor formation can provide somewhat densely packed devices, trenches generally require even less chip area. For example, when trenches are used for device isolation, they require far less area than the other commonly used major isolation structure: field oxides. Further, when trenches are used to make capacitors in DRAMs, the resulting trench capacitors occupy less area than most other DRAM capacitor types such as planar and stacked capacitors.

While trenches provide space saving advantages for certain applications, further improvements in device density may require trenches of increasing depth to width ratio (i.e., increasing aspect ratio). This is particularly true for DRAM applications because each trench capacitor of a DRAM must be capable of storing a certain minimum amount of charge in order to ensure that information is not lost between refresh cycles. As the amount of stored charge in a trench type capacitor is directly proportional to the surface area of the trench itself, the surface area lost in narrowing the trench must be made up by deepening the trench. Stated simply, as device spacing becomes compressed, the ratios of trench depth to width and trench depth to spacing must significantly increase.

It is believed that to develop 64 megabit or greater trench-type DRAMs, trenches having submicron widths and aspect ratios of at least about 2.5 to 1 (depth to width) must be formed. However, trench capacitors in current 16 megabit DRAMs produced by Texas Instruments Corporation have widths of about 1.5 $\mu$m and depths of only about 2.85 $\mu$m. Unfortunately, available trench forming techniques have not yet proved able to reliably attain the trench depth to width ratios necessary to reach the 64 megabit requirements.

In an effort to provide DRAM capacitors with greater surface area, some companies have employed "fin-type" capacitors. For example, in its 64 megabit DRAM, Hitachi Corporation has employed one fin-type capacitor in each DRAM cell. While providing somewhat increased capacitance on available chip surface area, fin-type capacitors have complex shapes and are therefore somewhat difficult to fabricate. Thus, if possible, it would be desirable to develop increased density DRAMs with the simpler trench-based technology.

Trenches are conventionally formed by an anisotropic chemical or reactive ion etching step on a masked substrate. Anisotropic etching refers to etching that is primarily vertical, without significant lateral undercutting. As should be apparent, deep narrow trenches can only be formed by highly anisotropic etches. The anisotropy of an etch can be controlled by various parameters such as the particular chemical species employed in a plasma reactor. In general, the faster and more strongly that a particular plasma species reacts with a given substrate material, the more isotropic the etch. For example, fluorine radicals very rapidly react with silicon to form volatile $SiF_4$ which then rapidly diffuses from the reaction site to provide a fresh surface for further reaction. Thus, fluorine etches of silicon generally proceed isotropically and are therefore unsuitable, when used alone, for etching trenches.

U.S. Pat. No. 4,916,511 issued to Douglas, and incorporated herein by reference for all purposes, describes a reactive ion etching process that employs forward sputtering to deposit mask material on trench sidewalls and ostensibly control the trench sidewall profile. According to the patent, the process removes oxide or other hard mask material from on top of a substrate and redeposits that material on the trench sidewall where it blocks lateral etching by a primary etchant species. The patent suggests that forward sputtering can be accomplished by a multistep process in which the etchant chemistry and process conditions in the reactor are varied with each step to facilitate relatively rapid etching while protecting trench sidewalls from lateral undercutting.

Unfortunately, controlling the reactor conditions, in the manner suggested by Douglas, likely cannot yield etches of sufficient anisotropy to produce the deep narrows trenches required for next generation trench-type DRAMs. Thus, what is needed is an improved method and apparatus for producing deep narrow trenches in chemical etching systems.

SUMMARY OF THE INVENTION

The present invention meets the aforementioned need by providing an anisotropic etching process employing a plasma reactor having at least three electrodes operated under conditions that promote forward sputtering. The three electrodes act in concert to generate a uniform plasma that is carefully directed onto the substrate. Prior systems that employed forward sputtering to control trench sidewall profiles were insufficiently controllable because they employed plasma reactors having only two electrodes. Using the methods and apparatus of this invention, trenches having submicron widths and aspect ratios of at least 2.5:1 (depth to width) can be prepared. Such trenches are particularly useful in the development of next generation gigabit DRAMs.

In a three electrode plasma reactor as used with the present invention, two of the electrodes may be employed to produce an electromagnetic field that is parallel with the plane of the wafer to be etched, thus producing a plasma that is highly uniform over the surface of the wafer. The third electrode directs the plasma onto the wafer in a highly controlled manner. In the past, when trench etching was performed under forward sputtering conditions, one of the two available reactor electrodes was used for two purposes (i.e., to generate the plasma and to direct it onto the wafer). Unfortunately, such systems provided inadequate control over the uniformity and/or vertical component of the etch.

Preferably, the wafer and three electrodes are aligned as follows. A support holds the substrate in a defined plane. The first electrode is located on the enclosure and is oriented substantially perpendicular to the plane defined by the substrate. This first electrode may actually form part of the reactor enclosure. The second electrode preferably is a substantially planar coil located above the substrate and oriented substantially parallel to the defined plane. Finally, the third electrode is located beneath the substrate and is oriented substantially parallel with the defined plane. A uniform plasma may be generated in this system by providing a radio frequency potential to the second electrode such that a planar radio frequency electromagnetic field is inductively coupled to the process gases in the reactor enclosure. The resulting uniform plasma can then be directed onto the substrate by applying a potential to a third electrode located beneath the substrate.

In one aspect, the invention provides a method for trench etching a substrate having a patterned hard mask (e.g., oxide or nitride). The method can be characterized by the following steps: (1) supporting a substrate to be etched within an enclosure; and (2) plasma etching selected portions of the substrate under defined etch conditions such that material of the patterned hard mask is forward sputtered to induce deposition on sidewalls of the trench during etching. In this method, the enclosure forms part of a three electrode plasma reactor as described above. Thus, the plasma is generated about the substrate by applying a potential between a first and a second electrode, and charged species are directed from the plasma onto the substrate by applying a potential to a third electrode.

During the plasma etching step, one or more gases is supplied to the enclosure. To promote forward sputtering in silicon etching systems, those gases may primarily include HCl or HBr. In addition, one or more of the following gases is preferably admixed therewith: nitrogen, argon, silicon tetrachloride, carbon monoxide, and carbon dioxide. Application of a relatively high bias between the second and third electrodes also promotes forward sputtering.

It will often be desirable to vary the etch conditions or etch gas composition during the step of plasma etching. In one preferred embodiment, a silicon substrate is initially etched with a gas composition chosen to remove a native oxide on exposed portions of the silicon substrate. A suitable gas for this application includes primarily boron trichloride. Then, after the first etch gas removes a few thousand angstroms of silicon and native oxide, a second gas is introduced to etch a few microns of silicon. The second gas composition should be chosen to substantially promote forward sputtering of the hard mask material. As noted, such gas may include primarily HCl or HBr. In addition, one or more of nitrogen, argon, silicon trichloride, carbon monoxide, and carbon dioxide may be added to promote sidewall deposition of forward sputtered material.

A second aspect of the invention provides an apparatus for etching a trench in a substrate. In this aspect, the apparatus may be characterized as including: (1) a source of an etching gas which etching gas includes primarily HCl or HBr (such as described above); (2) an enclosure having an interior in fluid communication with the source of etching gas; (3) a support for the substrate located within the interior of said enclosure and holding the substrate in a defined plane; (4) a first electrode and a second electrode arranged such that a radio frequency signal supplied to one of the first or second electrodes provides radio frequency energy to the interior of the enclosure for generating a plasma; and (5) a third electrode disposed below the support. Preferably, the three electrodes are oriented as described above. In general, the apparatus provides a plasma under conditions which promote forward sputtering of the hard mask to deposit material on sidewalls of the trench.

A third aspect of the invention provides an integrated circuit incorporating active devices and trench capacitors in a semiconductor substrate. The integrated circuit may be characterized as including the following: (1) a plurality of trench capacitors each having an insulated storage plate within a trench in the semiconductor substrate; and (2) a plurality of active devices arranged in a predefined circuit configuration with at least some of the plurality of trench capacitors. In such integrated circuits, at least some of the trench capacitors are provided in trenches having (i) a sub-micron primary dimension on the top surface of the semiconductor substrate, and (ii) an aspect ratio of at least 2.5:1 (trench depth in the substrate to trench primary dimension on the top surface of the substrate). The primary dimension is either the length or width of the trench. In preferred embodiments, the aspect ratio is at least about 3.0:1, and in especially preferred embodiments, it is at least about 3.5:1.

The integrated circuits of this invention may be DRAMs which incorporate multiple dynamic memory cells, each of which includes a trench capacitor and a pass transistor connected in series. This invention allows fabrication of DRAMs having a very high density of such memory cells on a single chip. In preferred embodiments, an integrated circuit of this invention includes at least about 1.5 billion dynamic memory cells (and more preferably about 2 billion such cells) on a monocrystalline silicon substrate. In some cases, the integrated circuits of this invention are provided as part of a digital system having a plurality of semiconductor integrated circuits. For example, the system may be multichip memory module.

These and other features and advantages of the invention will be described in more detail below with reference to the drawings.

DETAILED DESCRIPTION OF THE PREFERRED EMBODIMENTS

Figure 1:
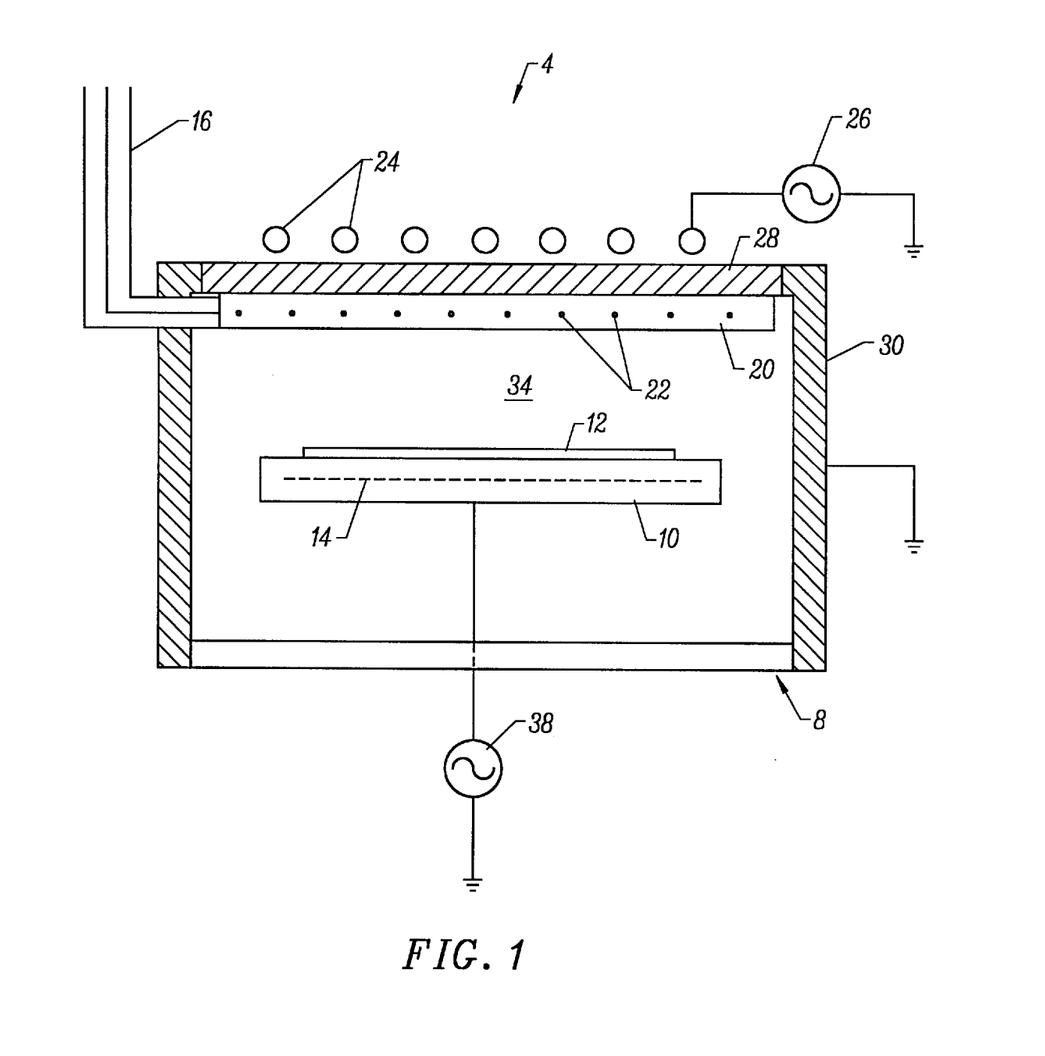
FIG. 1 is a cross-sectional view of a three-electrode system that may be used to implement a preferred embodiment of the present invention.

A preferred embodiment of the present invention will be described with reference to FIG. 1. A cross section of a three-electrode plasma reactor 4 includes an enclosure 8 having an interior space containing a wafer support 10 and a wafer 12 to be processed. As shown, the support 10 holds the wafer 12 in a defined plane (horizontal in this embodiment) with respect to the enclosure 8. The wafer may be mechanically clamped to the support. However, in one preferred embodiment, the support 10 is an electrostatic chuck which holds the wafer 12 in place without bowing. Such electrostatic chucks are described in Singer "Electrostatic Chucks in Wafer Processing" Semiconductor International, pp. 57–64 (April 1995) which is incorporated herein by reference for all purposes. The entire enclosure 8 can be evacuated to very low pressures with a turbomolecular pumping system (not shown).

One or more process gas is provided to the plasma reactor interior via a lines 16. The process gases enter the reactor interior through a diffuser or gas distribution member 20 which has a plurality of nozzles 22. Specifically, the 25 gases enter distribution member 20 from lines 16 and then are uniformly delivered to the reactor interior through nozzles 22.

Once in the reactor interior, the gases are converted to a plasma by radio frequency excitation. This is accomplished by applying a radio frequency signal to a coiled planar electrode 24 from a source of radio frequency energy 26. An electromagnetic field emanating from electrode 24 is inductively coupled to the reactor interior through a dielectric shield 28 and sets up an oscillating potential with respect to a grounded electrode 30. It should be noted that dielectric shield 28 and grounded electrode 30 together form part of enclosure 8. Further, the electrode 24 is oriented substantially in parallel with the wafer 12, and the electrode 30 is oriented substantially perpendicular to the wafer 12. The field resulting from the potential difference between electrodes 24 and 30 excites the free electrons and charged species in the gas to generate a plasma in region 34 above the wafer 12. A third electrode 14 located in support 10 directs the charged species in the plasma onto wafer 12 to assist the etching process. This third electrode preferably lies in the same plane as the wafer and is also controlled by a source of radio frequency energy 38. In preferred embodiments, the top planar electrode 24 and the bottom planar electrode (located in support 10) are driven by separate radio frequency power supplies. Preferably, they are operated at different frequencies. For example, one electrode may be operated at a relatively high frequency (e.g., 13.56 Mhz or above) and the other electrode may be operated at a relatively low frequency (e.g., 550 kHz or below).

As noted, the three electrode system described here normally separates the plasma generation and bias functions. Specifically, electrodes 24 and 30 control the plasma generation function and allow formation of large uniform plasmas capable of uniformly etching large substrates (e.g., on the order of 200 mm). In addition, a DC bias between electrodes 24 and 14 independently controls the ion bombardment energy. One exemplary three electrode system providing such separation of functions is the TCP 9400 reactor available from Lam Research Corporation of Fremont, Calif. In conventional two electrode systems, the plasma generation and bombardment functions are not separated, which leads to an inherently less controllable etch.

In some embodiments of this invention, four or more electrodes may be employed to achieve higher power and/or greater control of the etching process. Thus, for example, either or both of single electrodes 24 and 14 may be replaced concentric electrodes. In addition, for reactors designed to process multiple wafers simultaneously, it may be desirable to employ an additional electrode under each wafer region to improve process control and increase power.

It should be understood that while plasma processes that rely primarily upon momentum transfer (deemed "physical etching" and including such processes as ion milling and sputtering) are inherently anisotropic, they are also rather nonselective. That is, they tend to etch all materials at about equal rates. Thus, they are unsuitable for forming trenches as both masks and substrates are etched at about the same rate. Hence the processes of this invention will rely on chemical, as well as physical etching mechanisms. Conventional systems that rely on both chemical and physical etching mechanisms include systems for reactive ion etching, plasma assisted dry chemical etching, etc. The present invention is directed to modified versions of these conventional systems, with the modifications being (1) the use of a three or more electrode reactor to provide good plasma control and uniformity, and (2) the application of reaction conditions that promote forward sputtering of mask material into a trench.

Various parameters can be controlled to promote forward sputtering. It should be understood that the amount of forward sputtering directly controls the slope in the trench sidewall. As more material is deposited on the sidewalls, the slope tends to deviate from vertical, so that the sidewalls approach one another toward the bottom of the trench in a "V" shape. On the other hand, less forward sputtering promotes more anisotropic etching which produces more vertical sidewalls. Of course, if no forward sputtering or other measure for protecting sidewalls is employed, the etch may become sufficiently isotropic that lateral undercutting occurs. This means that substrate material is removed from underneath the mask—a generally undesirable result. In preferred embodiments of this invention, the etch is conducted under conditions which promote sidewalls having slopes of between about 80° and 90° from the vertical.

As conditions are adjusted to make the etch more vertical (less forward sputtering), a trench's depth can be increased while maintaining a relatively small, even submicron, trench width. While such deep narrow trenches may provide the high surface area required for high capacity capacitors, they can be quite difficult to implant at their vertical sidewalls. Thus, for applications requiring high doping concentrations around a trench, it may be desirable to provide trenches with somewhat less steep sidewalls (more forward sputtering).

In general, optimal or nearly optimal reactor conditions for controlling forward sputtering (and subsequent deposition) can be reproducibly obtained by adjusting such parameters as the total pressure within the reactor, the partial pressures of the individual gases, the radio frequency power used to maintain the plasma, the bias between electrodes 24 and 14, and the angle of the mask sidewall at the edge of the trench. Turning first to the etchant composition, the primary etchant should not only be able to etch the substrate but should also tend to dislodge some material from the mask. For a silicon substrate with a silicon oxide mask, the primary etchant preferably is a hydrogen halide such as hydrogen chloride or hydrogen bromide gas. Such materials are preferred over halogens such as chlorine because the molecular mass of the impacting species (e.g., $Cl^+$ rather than $Cl_2^+$) has an atomic number closely matched to that of the average atomic number of the mask material. Thus, the sputtering yield is improved. In addition, the HCl supplies hydrogen which may assist in sidewall deposition.

Other gases have been observed to increase sidewall buildup of sputtered material. Such gases include nitrogen, argon, carbon monoxide, carbon dioxide, and silicon tetrachloride. Thus, preferred embodiments of this invention employ etchant compositions that utilize a hydrogen halide as a primary etchant and one or more additives which increase sidewall buildup of sputtered mask materials. A particularly preferred etchant gas includes hydrogen chloride (HCl), nitrogen ($N_2$), and silicon tetrachloride ($SiCl_4$).

Gas compositions that promote forward sputtering and subsequent sidewall deposition of the sputtered material promote, as noted, V-shaped trenches. Vertical trenches may be produced by adding a small amount of mask etchant to the gas flowing into the reactor. For silicon substrates with silicon dioxide mask layers, boron trichloride ($BCl_3$) is one suitable oxide etchant. In one embodiment, less than 3 sccm BCl$_3$ can greatly reduce the buildup of sidewall oxide, thus promoting vertical trench sidewalls.

Other factors which promote forward sputtering include high reactor gas pressures (to promote nucleation of mask materials on sidewalls), high bias power between the second and third electrodes, and slightly faceted mask sidewalls. Turning first to the issue of gas pressure, a preferred pressure range for etching silicon having an oxide mask with an HCl based etchant is from about $10^{-5}$ to 5 Torr, and more preferably between about 1 to 500 millitorr, and most preferably between about 1 and 30 millitorr. Within these ranges, two considerations come into play. First, if the pressure is too high, some sputtered mask material may nucleate in the gas phase when using deposition promoting additives such as SiCl$_4$. By maintaining a relatively low reactor pressure, one reduces the probability of gas phase oxide nucleation which could produce damaging gas phase particulates. Second, as the pressure is lowered, the etch rate becomes slower. It should also be noted that if the pressure becomes sufficiently low (on the order of a few millitorr), the mean free paths of the reactant and product species are large in comparison to the reactor geometry, thus further promoting an anisotropic etch.

Preferably, the bias power between the second and third electrodes in the reactor will be on the order of a few tens of watts (e.g., between about 10 and 50 watts) to promote forward sputtering. Increasing power in the third electrode (located below the substrate) increases the ion bombardment energy at the substrate surface. Within the above ranges, the use of lower bias will reduce etch rate and sidewall oxide deposition, while the use of higher bias voltages will increase etch rate and side wall deposition. A particular advantage of the systems of this invention results from the ability to independently control the ion flux in the plasma (by controlling the amount of energy introduced to the system through the second electrode) and the normal velocity imparted to the reactive species (by controlling the power output of the third electrode).

Figure 2:
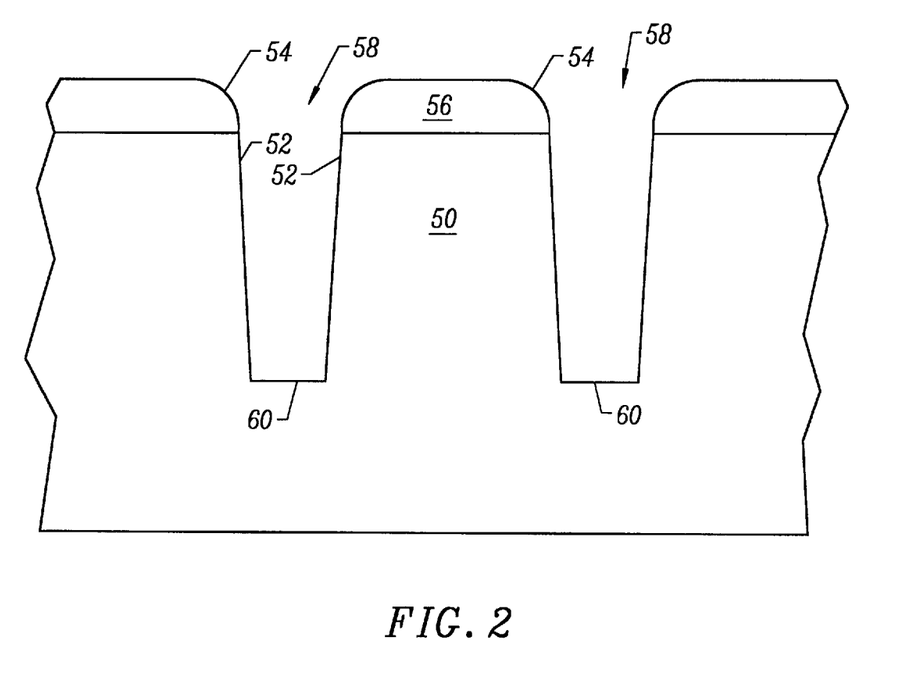
FIG. 2 is a cross-sectional view of a trench being formed in accordance with the present invention.

As noted in U.S. Pat. No. 4,916,511, previously incorporated by reference, another factor which affects the degree of forward sputtering, and therefore the trench sidewall angle, is the initial sidewall slope of the hardmask sidewalls. This feature is shown in FIG. 2 where the sidewalls 54 of the oxide hardmask 56 on substrate 50 are preferably not quite at 90° angles.

Angles of 80° to 89° are preferred for this invention. More sloped hard mask sidewalls will in general lead to more hard mask forward sputtering and deposition in trenches formed at exposed regions 58. However, the slope should not be so great that the hard mask is eroded to the point that the substrate is damaged at the upper corners of the trench. The hard mask sidewalls angle may be set to 80° to 89° in a resist profile of a photostabilized photoresist (using deep UV flood exposure plus an extra postbake). The resist sidewall profile will be transferred into the oxide hard mask sidewall during the oxide etch which patterns the hard mask.

Each of the above physical process conditions may be independently adjusted within the context of this invention to achieve specific desired results in addition to etch profile control. It is within the skill of those in the art to identify optimal pressures, biases, and other reactor conditions for forward sputtering of mask material in the reactor systems of this invention.

In some embodiments, the reactor conditions including etch gas composition vary while trench etching occurs. In one preferred embodiment, a silicon substrate is initially etched with a gas composition chosen to remove a native oxide on exposed portions of the silicon substrate. A suitable reactant gas for this application includes primarily boron trichloride. Then, after the first etch gas removes a few thousand angstroms of silicon and native oxide, a second gas is introduced to etch a few microns of silicon. The second gas composition should be chosen to substantially promote forward sputtering of the hard mask material. As noted, such gas may include primarily HCl or HBr. In addition, one or more of nitrogen, argon, silicon trichloride, carbon monoxide, and carbon dioxide may be added to promote sidewall deposition of the sputtered material. It may be desirable to perform additional steps that do not promote sidewall deposition in order to further control the sidewall profile. In one embodiment, for example, the etchant gas is initially HCl with a sidewall deposition promoting agent such as SiCl$_4$. Later, the etch is performed exclusively with HCl, and finally with HCl and a sidewall deposition promoting agent.

After etching is complete, it may be desirable to remove sidewall material accumulated from forward sputtering during etching. Such material can be removed by, for example, a short wet etch in HF or a short high-pressure fluoro-etch using for example CF$_3$Cl or C$_2$F$_6$.

As noted, the present invention finds applications in forming high density high capacitance trench capacitors for next generation DRAMs. In such devices, the semiconductor substrate forms one electrode of the capacitor, a thin layer dielectric lining the trench walls forms the insulator of the capacitor, and a plug of polysilicon in the trench forms the second electrode of the capacitor. A charged trench capacitor represents a logical 1, and an uncharged trench capacitor represents a logical 0.

As noted, high density packing of trench capacitors on a chip requires trenches having high aspect ratios. Referring again to FIG. 2, the relevant dimensions are defined as follows. The distance between trench sidewalls 52 defines the trench width or "primary dimension" (at least at the top of the trench) and the distance between the top of the substrate and the trench floor 60 defines the trench depth. Preferably, a trench formed in accordance with this invention will have an aspect ratio (defined as depth to width) of at least about 2.5:1, more preferably at least about 3.0:1, even more preferably at least about 3.25:1, and most preferably at least about 3.5:1. Further, the trenches of this invention should preferably have a width of not more than about 1 micron. Thus, for example, a one-half micron wide trench should have a depth of at least about 1.25 microns in accordance with this invention. More preferably, the depth will be at least about 1.5 microns and most preferably about 1.75 microns.

Figure 3A:
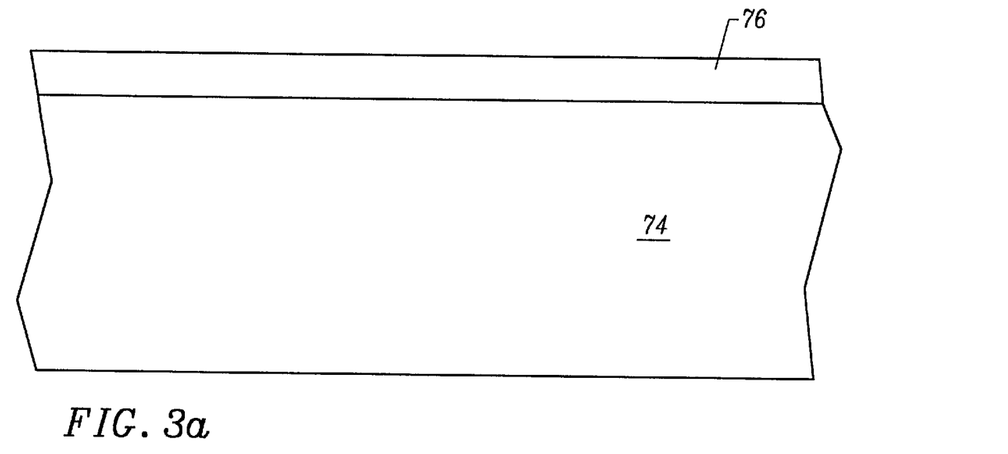
FIGS. 3a–3f are cross-sectional views of a substrate at various stages of trench capacitor fabrication.

Various well-known processes can be employed for fabricating trench capacitors utilizing trenches prepared in accordance with this invention. One suitable fabrication process flow for forming a trench capacitor will now be described with reference to FIGS. 3a to 3f. The process begins as shown in FIG. 3a with a substrate 74 having a mask layer 76 provided on the top surface thereof. The substrate 74 is typically a uniformly and lightly p doped single crystal silicon wafer. However, it may of course be an n doped silicon and/or include regions of nonuniform doping and may even include an epitaxial layer. The mask layer 76 is chosen to resist attack by the etching species subsequently used to form the trench. Preferably, mask layer 76 will be silicon oxide, silicon nitride, or alternating layers of silicon oxide and nitride.

Figure 3B:
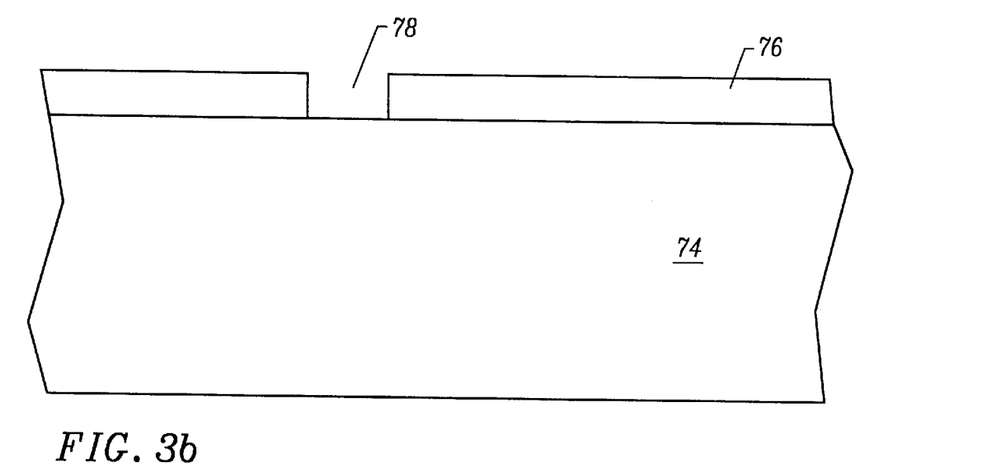

The mask layer 76 is patterned as shown in FIG. 3b to define an exposed region 78 on the top surface of substrate 74. In general, the mask will include regions containing an etchant resistant material (e.g., oxide or nitride) which protects the underlying semiconductor material during etch, and exposed regions which define locations where trenches are to be etched. The patterning process may be performed by photolithography for example. After the mask is formed, a plasma etch is performed in accordance with this invention to produce the structure shown in FIG. 3c. Thus, the etch will be performed in a reactor having three or more electrodes and under conditions that promote forward sputtering of mask material. The etching process will carve a trench 80 in substrate 74 while providing barrier regions 82 on the sidewalls of trench 80.

Figure 3C:
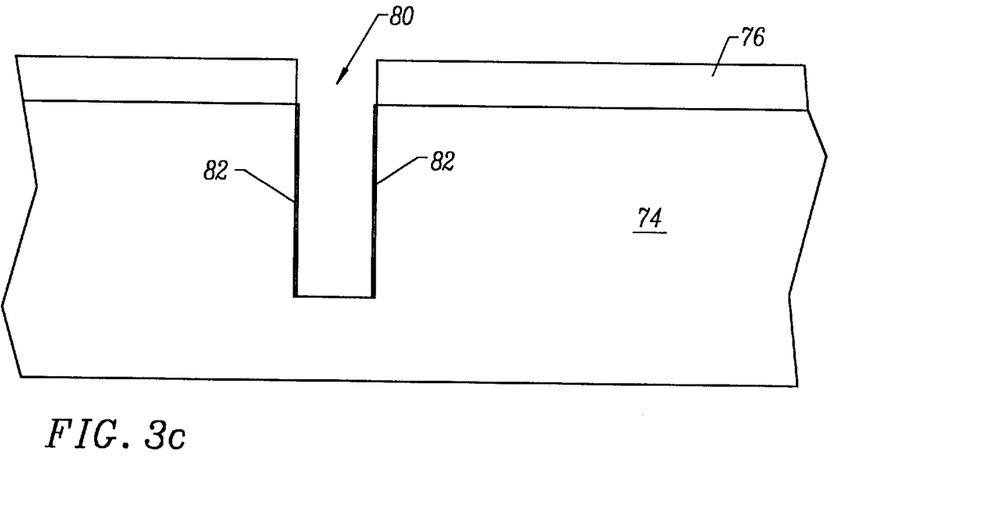
Figure 3D:
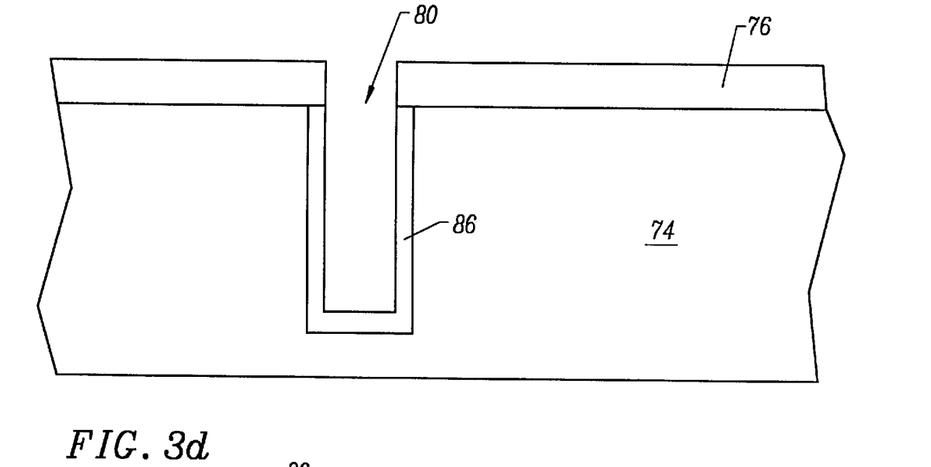
Figure 3E:
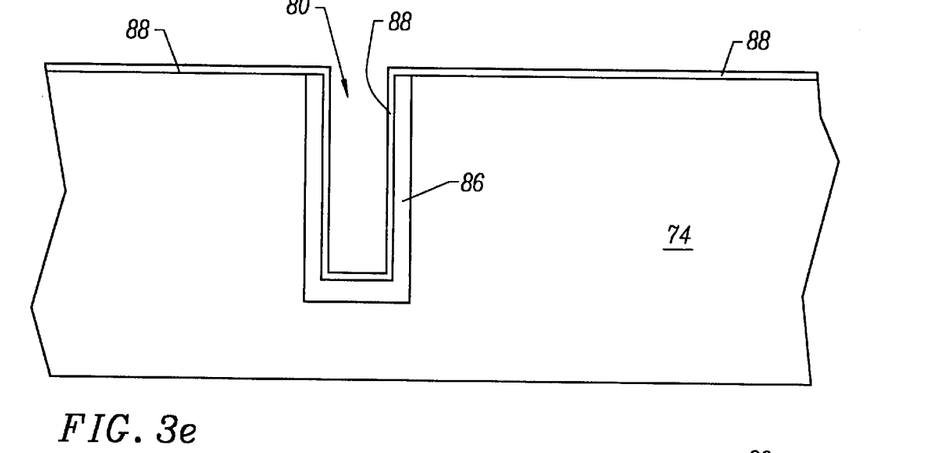
Figure 3F:
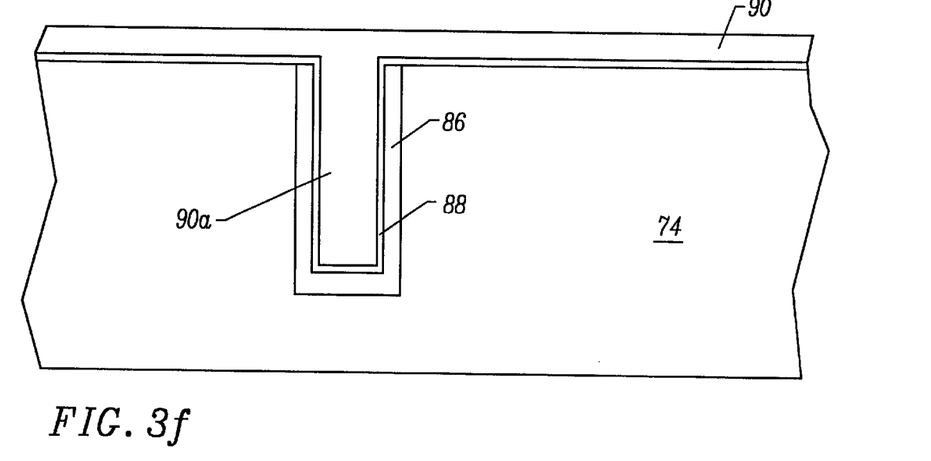

After the deep trench has been formed as indicated in FIG. 3c, an implant is conducted to form an n+ region 86 on the sidewalls and floor of trench 80. Region 86 serves as one plate of the subsequently completed trench capacitor. Region 86 may be formed by a variety of alternative techniques such as diffusion from a solid source or from a gas-phase dopant source species.

After forming region 86, mask layer 76 is removed by a wet etch, chemical mechanical polishing, or other suitable process. Thereafter, a thin dielectric layer 88 of oxide or nitride for example is conformally deposited over the trench 80 and exposed surface of substrate 74 to provide the structure shown in FIG. 3e. Other high dielectric materials may used in place of an oxide or nitride to further increase the capacitor's capacitance. Finally, a layer of polysilicon 90 is conformally deposited on the substrate surface to produce the structure shown in FIG. 3f. The polysilicon that fills trench 80 forms an insulated plate 90a of the trench capacitor.

In a DRAM, a trench capacitor forms part of a single memory cell that also includes an active device such as an MOS transistor. More specifically, a memory cell typically includes one of said trench capacitors and a pass transistor connected in series. Multiple memory cells are arranged in a predefined circuit configuration to form the DRAM. Specifically, in each cell, the transistor's gate is connected to a word line, one transistor drain/source is connected to a first plate of the trench capacitor (e.g., the n+ region 86), and the other drain/source is connected to a bit line. Using the methods of this invention to form deep trenches (of 80° to 90° sidewall angle), many if not all of the DRAM capacitors will have (1) submicron widths and (2) aspect ratios of at least about 2.5:1 (depth to width), and more preferably at least about 3.0:1 or 3.5:1. Such devices may be formed on a single DRAM chip capable of storing at least one gigabit of data. For example, using trench capacitors of this invention, a 1.5–2 gigabit DRAM could be provided on a single monocrystalline silicon chip. In some cases, the DRAMs or other integrated circuits prepared in accordance with this invention are provided as part of a digital system having a plurality of semiconductor integrated circuits. For example, the system may be multichip memory module.

Although a preferred embodiment of the present invention has been described in detail, it should be understood that the present invention may be embodied in many other specific forms without departing from the spirit or scope of the invention. Particularly, it should be understood that the exact sizing, shaping, and placement of the reactor electrodes may be widely varied within the scope of the present invention. Further, the exact material compositions of the source gases can be varied somewhat and still provide good anisotropic etching within the scope of this invention. Therefore, the present embodiments are to be considered as illustrative and not restrictive, and the invention is not to be limited to the details given herein, but may be modified within the scope of the appended claims.

What is claimed is:

1. A method of etching a trench in a substrate having a top surface, the method comprising the following steps:
    supporting said substrate within an enclosure; and
    plasma etching selected portions of said substrate under defined etch conditions such that material from the top surface of the substrate is forward sputtered to induce deposition on sidewalls of said trench during etching, wherein a first electrode includes a coil electrically coupled to a radio frequency power source such that by inductive coupling a plasma is generated about the substrate by applying a potential between a first and a second electrode, and wherein charged species are directed from said plasma onto said substrate by applying a potential to a third electrode.

2. The method of claim 1 wherein the material from the top surface of the substrate includes an oxide, a nitride, a silicate glass, or a combination thereof.

3. The method of claim 1 wherein the substrate is supported in a defined plane, and
    wherein the first electrode is oriented substantially perpendicular to said defined plane, and the second electrode is located above the substrate and is oriented substantially parallel to said defined plane, with the potential being produced by a radio frequency signal in the second electrode, and
    wherein the third electrode is located beneath the substrate and is oriented substantially parallel with the defined plane.

4. The method of claim 1 wherein the step of plasma etching includes the following steps:
    introducing a gas of defined composition chosen to promote forward sputtering of the material from the top surface of the substrate;
    producing the plasma within said enclosure by applying a potential between said first and second electrodes; and
    directing said plasma onto said substrate under said defined etch conditions such that material from the top surface of the substrate is forward sputtered to induce deposition on sidewalls of said trench during etching, wherein the one or more gases are provided at the substrate surface while said plasma is being produced.

5. The method of claim 4 wherein the defined composition of the gas changes during the step of plasma etching.

6. The method of claim 5 wherein the substrate is silicon and wherein a first gas composition is supplied initially in the step of plasma etching, and said first gas composition is chosen to remove a native oxide on exposed portions of the silicon substrate.

7. The method of claim 6 wherein the first gas composition is boron trichloride.

8. The method of claim 5 wherein the substrate is silicon and wherein a second gas composition is supplied after the first gas composition in the step of plasma etching, and wherein the second gas composition is chosen to substantially promote forward sputtering of the material from the top surface of the substrate.

9. The method of claim 8 wherein the second gas composition includes primarily HCl or HBr.

10. The method of claim 1 wherein the trench formed by said method has (i) a sub-micron primary dimension on the top surface of said substrate, and (ii) an aspect ratio of at least 2.5:1, said aspect ratio representing the ratio of the trench's depth in the substrate to the trench's primary dimension on the top surface of the substrate.

11. The method of claim 10 further comprising steps of forming complete devices on the substrate such that an integrated circuit is formed.

12. A method of etching a trench in a substrate having a top surface covered by a patterned hard mask, the method comprising the following steps:

supporting said substrate within an enclosure; and plasma etching selected portions of said substrate under defined etch conditions such that material of the patterned hard mask is forward sputtered to induce deposition on sidewalls of said trench during etching, wherein a first electrode includes a coil electrically coupled to a radio frequency power source such that by inductive coupling a plasma is generated about the substrate by applying a potential between a first and a second electrode, and wherein charged species are directed from said plasma onto said substrate by applying a potential to a third electrode.

13. The method of claim 12 wherein the hard mask includes an oxide, a nitride, a silicate glass, or a combination thereof.

14. The method of claim 12 wherein the substrate is supported in a defined plane, and wherein the first electrode is oriented substantially perpendicular to said defined plane, and the second electrode is located above the substrate and is oriented substantially parallel to said defined plane, with the potential being produced by a radio frequency signal in the second electrode, and wherein the third electrode is located beneath the substrate and is oriented substantially parallel with the defined plane.

15. The method of claim 12 wherein the step of plasma etching includes the following steps:

introducing a gas of defined composition chosen to promote forward sputtering of the hard mask material;

producing the plasma within said enclosure by applying a potential between said first and second electrodes; and directing said plasma onto said substrate under said defined etch conditions such that material of the patterned hard mask is forward sputtered to induce deposition on sidewalls of said trench during etching, wherein the one or more gases are provided at the substrate surface while said plasma is being produced.

16. The method of claim 15 wherein the substrate is silicon, the hard mask material includes a silicon oxide, and the one or more gases introduced into the enclosure include HCl, HBr, $SiCl_4$, or a combination thereof.

17. The method of claim 15 wherein said defined etch conditions change during the step of plasma processing.

18. The method of claim 15 wherein the defined composition of the gas changes during the step of plasma etching.

19. The method of claim 18 wherein the substrate is silicon and wherein a first gas composition is supplied initially in the step of plasma etching, and said first gas composition is chosen to remove a native oxide on exposed portions of the silicon substrate.

20. The method of claim 19 wherein the first gas composition is boron trichloride.

21. The method of claim 18 wherein the substrate is silicon and wherein a second gas composition is supplied after the first gas composition in the step of plasma etching, and wherein the second gas composition is chosen to substantially promote forward sputtering of the hard mask material.

22. The method of claim 21 wherein the second gas composition includes primarily HCl or HBr.

23. The method of claim 22 wherein the second gas composition further includes one or more of the following gases: nitrogen, argon, silicon tetrachloride, carbon monoxide, and carbon dioxide.

24. The method of claim 12 wherein the trench formed by said method has (i) a sub-micron primary dimension on the top surface of said substrate, and (ii) an aspect ratio of at least 2.5:1, said aspect ratio representing the ratio of the trench's depth in the substrate to the trench's primary dimension on the top surface of the substrate.

25. The method of claim 24 further comprising steps of forming complete devices on the substrate such that an integrated circuit is formed.

* * * * *